United States Patent
Chen

[11] Patent Number: 6,162,683
[45] Date of Patent: Dec. 19, 2000

[54] SYSTEM AND METHOD FOR FORMING AN INTER-LAYER DIELECTRIC IN FLOATING GATE MEMORY DEVICES

[75] Inventor: Men-Chee Chen, Dallas, Tex.

[73] Assignee: Texas Instruments Incorporated, Dallas, Tex.

[21] Appl. No.: 09/216,675

[22] Filed: Dec. 18, 1998

Related U.S. Application Data

[60] Provisional application No. 60/068,229, Dec. 19, 1997.

[51] Int. Cl.[7] .............................. H01L 21/8247
[52] U.S. Cl. ........................... 438/258; 438/981
[58] Field of Search ..................... 438/257, 258, 438/261, 264, 528, 981

[56] References Cited

U.S. PATENT DOCUMENTS

| | | | |
|---|---|---|---|
| 4,651,406 | 3/1987 | Shimizu et al. | 438/258 |
| 5,923,975 | 7/1999 | Rolandi | 438/258 |
| 6,004,847 | 12/1999 | Clementi et al. | 438/258 |

*Primary Examiner*—Chandra Chaudhari
*Attorney, Agent, or Firm*—Jacqueline J. Garner; W. James Brady, III; Frederick J. Telecky, Jr.

[57] ABSTRACT

A method of forming a floating gate memory device having a memory array region (11), a first periphery region (15), and a second periphery region (17) is provided that comprises forming a polysilicon gate (18) insulatively disposed outwardly from a substrate (10) in the memory array region (11). The polysilicon gate (18) is doped with nitrogen ions. A first oxide layer (20) is formed outwardly from the substrate (10) in the first and second periphery regions (15) and (17) and from the polysilicon gate (18) of the memory array region (11). The thickness of oxide formed outwardly from the substrate (10) is greater relative to the thickness of oxide formed outwardly from the polysilicon gate (18). The first oxide layer (20) in the second periphery region (17) is removed. A second oxide layer (22) is formed outwardly from the substrate (10) of the second periphery region (13), from the first oxide layer (20) in the first periphery region (15) and from the polysilicon gate (18) of the memory array region (11). The thickness of the second oxide layer (22) formed in the first and second periphery regions (15) and (17) is greater relative to the thickness of oxide formed in the memory array region (11).

20 Claims, 2 Drawing Sheets

SYSTEM AND METHOD FOR FORMING AN INTER-LAYER DIELECTRIC IN FLOATING GATE MEMORY DEVICES

This application claims priority under 35 USC § 119(e)(1) of provisional application Ser. No. 60/068,229, filed Dec. 19, 1997.

TECHNICAL FIELD OF THE INVENTION

This invention relates in general to the field of electronic devices and more particularly to a system and method for forming an inter-layer dielectric in floating gate memory devices.

BACKGROUND OF THE INVENTION

One type of modern nonvolatile memory is the EPROM or EEPROM device that uses floating gate structures. The memory cells within the devices use general hot electrons for programming from the drain side and use Fowler-Nordheim tunneling for erasure from the source site. These devices are also known as flash memory devices. The gate structure for these devices is typically a stack configuration comprising a floating gate and a control gate separated by an insulator layer. The gate stack is typically disposed on a tunnel oxide layer.

Flash memory device memory cells comprise the gate stack structure discussed above. These memory cells make up a memory array region of the flash memory device. In addition to the portion of the chip utilized to form the memory array itself, flash memory devices require a substantial amount of support circuitry integrated within the same semiconductor chip. This support circuitry may comprise, for example, a read/write/erase control circuit, a decoder, or other necessary controlling components. This control circuitry occupies a region of the device hereafter referred to as a periphery region. Thus, flash memory devices comprise a memory array region and a periphery region. The periphery of a flash memory device further comprises a high voltage area and a low voltage area.

During the formation of a flash memory device, it is generally necessary to form structures and/or layers of semiconductor material on one region of the flash memory device that are not present on the other region, or to form structures and/or layers that require different dimensions on different regions of the flash memory device. For example, the gate stack described above may require the deposition of layers not required in the support circuitry of the periphery region.

These differences in the formation of semiconductor structures between the two regions of a flash memory device require the addition of several semiconductor processing steps, with the accompanying increase in the time and cost of processing. For example, three different thicknesses of dielectric material are required after the formation of the polysilicon gate structures present in the memory array region of flash memory devices. The first dielectric thickness is that placed over the floating gate structures. A second and third dielectric thicknesses are disposed in the periphery region of the device. The thickness of dielectric material needed to insulate portions of the support structures in the high voltage periphery region of the substrate and the thickness required to insulate portions of the support structures in the low voltage peripheral region is significantly different. In current semiconductor fabrication processes, three distinct pattern, etch, and removal sequences must be utilized to achieve these three varied thicknesses of the dielectric material. The additional processing poses significant constraints on the processing time and per unit cost required to fabricate flash memory devices.

SUMMARY OF THE INVENTION

In accordance with the teachings of the present invention, a system and method for forming an inter-layer dielectric in floating gate memory devices is provided that substantially eliminates or reduces the disadvantages associated with prior techniques and processes.

In accordance with one embodiment of the present invention, a method of forming a floating gate memory device having a memory array region, a first periphery region, and a second periphery region comprises forming a polysilicon gate insulatively disposed outwardly from a substrate in the memory array region. The polysilicon gate is doped with nitrogen ions. A first oxide layer is formed outwardly from the substrate in the first and second periphery regions and from the polysilicon gate of the memory array region. The thickness of oxide formed outwardly from the substrate is greater relative to the thickness of oxide formed outwardly from the polysilicon gate. The first oxide layer in the second periphery region is removed. A second oxide layer is formed outwardly from the substrate of the second periphery region, from the first oxide layer in the first periphery region, and from the polysilicon gate of the memory array region. The thickness of the second oxide layer formed in the first and second periphery regions is greater relative to the thickness of the second oxide layer formed in the memory array region.

The present invention has several important technical advantages. For example, the disclosed invention allows the production of flash memory devices with a substantial savings in processing time and cost of production. In particular, the present invention allows for the fabrication of three different thicknesses of a dielectric layer, each occupying distinct regions of the flash memory device, with a simplified fabrication process. In addition, the present invention allows for the elimination from the process flow of a complete sequence of depositing a pattern masked layer, etching portions of the underlying material not covered by the pattern masked layer, and etching or otherwise removing the pattern masked layer. Other technical advantages will be readily apparent to one skilled in the art from the following figures, descriptions and claims.

BRIEF DESCRIPTION OF THE DRAWINGS

For a more complete understanding of the present invention and its advantages thereof, reference is now made to the following brief description, taken in conjunction with the accompanying drawings and detailed description, wherein like reference numerals represent like parts, in which.

DETAILED DESCRIPTION OF THE INVENTION

Figure 1:
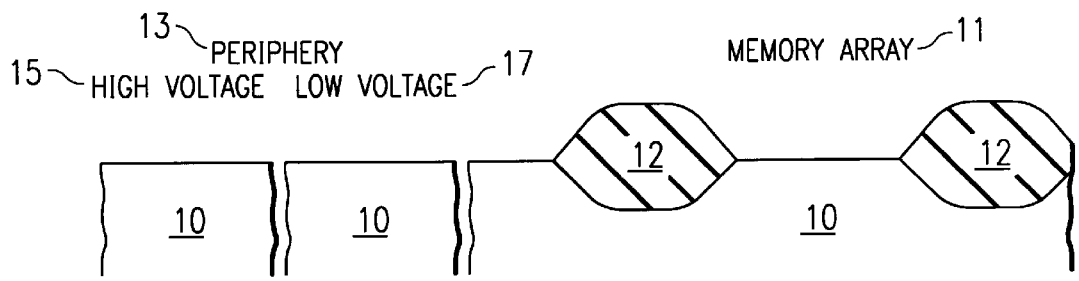
FIGS. 1–7 are schematic cross-sectional diagrams of the formation of inter-layer dielectrics of a flash memory device formed according to the teachings of the present invention.

The preferred embodiments of the present invention and its advantages are best understood by referring now in more detail to FIGS. 1–7 of the drawings, in which like numerals refer to like and corresponding parts of various drawings.

As shown in FIGS. 1–7, a flash memory device has two separate regions in which different structures and layers are formed from a substrate 10. These two regions include a memory array region 11 comprising memory cells and a periphery region 13 containing a high voltage area 15 and a low voltage area 17 for the construction of high and low voltage support circuitry respectively.

Substrate 10 may be a wafer formed from a single crystalline silicon material. Substrate 10 may also comprise other materials. For example, substrate 10 may comprise an epitaxial material, a polycrystalline semiconductor material, or other suitable material. Substrate 10 may also comprise additional layers of semiconductor material.

FIG. 1 illustrates the formation of isolation structures 12 disposed from the substrate 10 in memory array region 11 of the device. Isolation structures 12 will isolate the floating gate transistors subsequently formed in memory array region 11 of the flash memory device from other nearby floating gate transistors. Isolation structures 12 may be formed using shallow trench isolation (STI) techniques, for example. Using STI, a shallow trench may be etched into substrate 10, using a plasma-etch process generally known in the art, to form a trench of the desired depth. The shallow trench is then commonly filled, for example, by the growth of a thin, 100–200 Angstrom thick, liner oxide (not shown), followed by the deposition of additional oxide material (not shown). The oxide may comprise, for example, silicon dioxide. It will be understood that oxide may comprise other material capable of isolating an active semiconductor device from neighboring devices, such as silicon nitride, for example. Alternatively, isolation structures 12 may be formed using a process such as local oxidation of silicon (LOCOS). Isolation structures 12 should be on the order of 3,000 Angstroms in thickness after formation.

Figure 2:
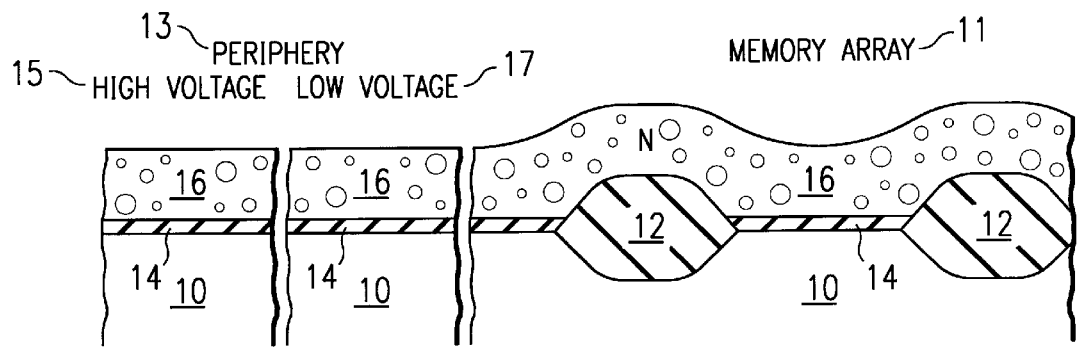

As shown in FIG. 2, an insulator layer 14 is grown outwardly from the entire surface of substrate 10. Insulator layer 14, commonly referred to as a tunnel oxide layer in flash memory devices, may comprise either oxide or nitride on the order of 90 Angstroms in thickness. It will be understood that insulator layer 14 may comprise other materials suitable for insulating semiconductor elements.

Also shown in FIG. 2 is the formation of a polysilicon layer 16 comprising amorphous silicon. Polysilicon layer 16 is conformally deposited outwardly from insulator layer 14 in both memory array region 11 and periphery region 13. Polysilicon layer 16 can be grown to a thickness of 1,500 Angstroms, for example. Polysilicon layer 16 may be doped as it is deposited. For example, for n-type polysilicon material, phosphorus doping agents may be introduced. An additional dopant taught by an embodiment of the present invention is the introduction of nitrogen into polysilicon layer 16. Any suitable process of nitridation may be used, such as nitrogen implantation or introducing a nitrogen rich gas during the deposition of the amorphous silicon comprising polysilicon layer 16. If nitrogen ions are implanted into polysilicon layer 16, the energy of the ions may be selected to avoid implantation damage to insulator layer 14. Nitrogen dopant ions may be implanted at an energy of 25 KeV, for example. Nitrogen dopant ions may be implanted at a dosage of at least $1 \times 10^{20}$ cm$^{-3}$ for optimal implementation with the method of the present invention. For example, to achieve the differences in growth rate of the oxide layer described below between the periphery region and the memory array region this optimal dosage is recommended. At lighter dosage levels such as $1 \times 10^{19}$ cm$^{-3}$ and below, a growth difference may still be achieved but at a reduced differential. Such a reduced differential in growth rate may actually be desirable in some applications. Thus, polysilicon layer 16 may comprise amorphous polysilicon containing phosphorus and nitrogen dopants.

Figure 3:
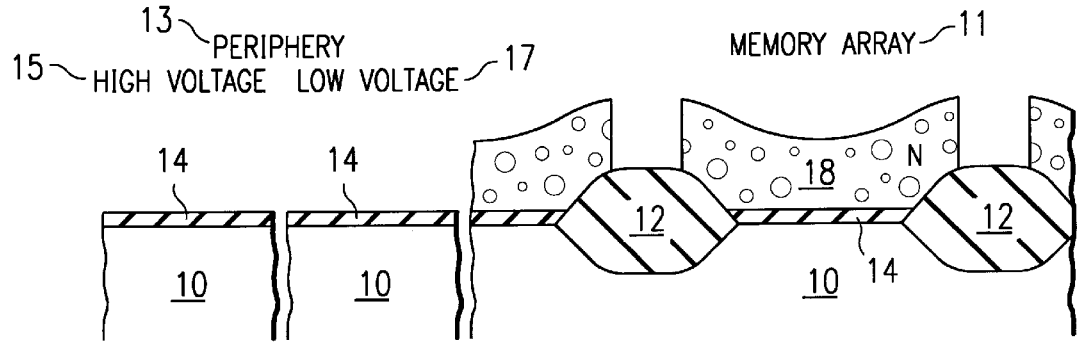

Following the deposition of polysilicon layer 16, a photoresist layer (not shown) is deposited outwardly from the polysilicon layer 16 and patterned using traditional photolithographic techniques. As shown in FIG. 3, exposed portions of polysilicon layer 16 are then etched to form a floating gate 18 of the desired dimensions in memory array region 11 of the device. The photo resist layer is then stripped by a conventional process, such as a resist ash. It should be noted that during the etch to form floating gate 18, entire periphery region 13 of the flash memory device is exposed, thereby removing all of polysilicon layer 16 from periphery region 13 of the flash memory device.

Figure 4:
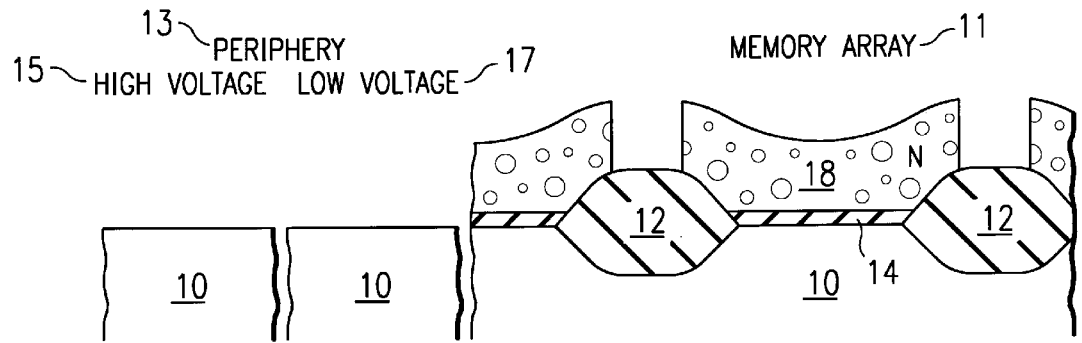

Following the formation of floating gate 18, a deglaze process generally known in the art is used to etch and remove any remaining exposed portions of insulator layer 14 from the flash memory device, as shown in FIG. 4. For example, the etch process generally used to form floating gate layer 18 may result in a minimal etch of insulator layer 14, reducing the thickness of insulator layer 14 from 90 Angstroms to 75 Angstroms where exposed by the patterned mask. The remaining 75 Angstroms of insulator layer 14 is then removed by the deglaze process resulting in a bare substrate 10 in periphery region 13.

Figure 5:
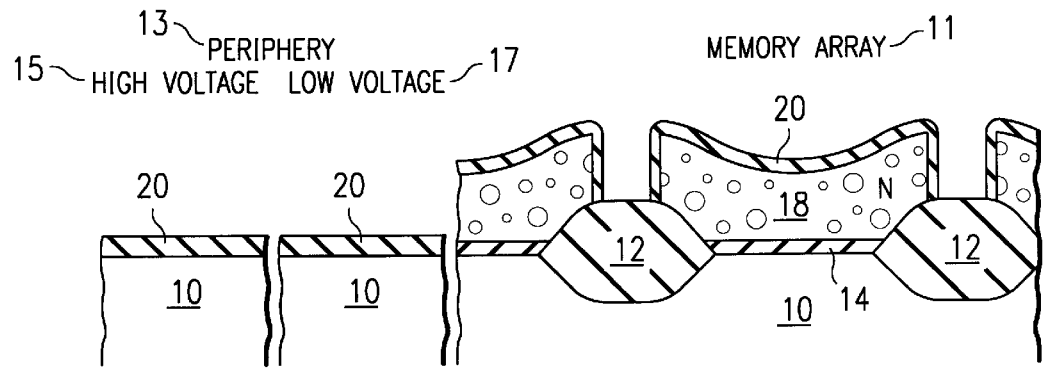

FIG. 5 shows the formation of a first oxide layer 20 on the surface of the semiconductor device. First oxide layer 20 comprises silicon dioxide grown from the surface of the exposed silicon comprising substrate 10 and floating gate 18. First oxide layer is grown to a thickness of 120 Angstroms over periphery region 13, for example. However, the rate of oxide growth on the exposed silicon of substrate 10 is significantly different from the growth rate of oxidation on the exposed silicon on floating gate 18 in memory array region 11. This difference in growth rate can be accounted for by the implantation of nitrogen dopants into polysilicon layer 16 that formed floating gate 18 according to the teachings of the present invention. The nitrogen doped silicon content of floating gate 18 results in a decreased rate of oxidation on the surface of floating gate 18. Specifically, in a process that achieves the growth of a 120 Angstroms layer of oxidation from the surface of substrate 10 in periphery region 13 of flash memory device, a growth of approximately 100 Angstroms of oxidation will be achieved on the exposed surface of nitrogen doped silicon comprising floating gate 18.

Figure 6:
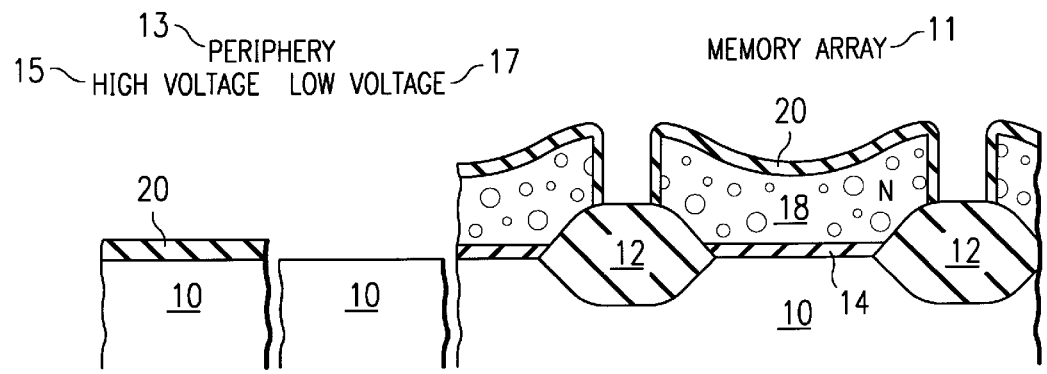

After the formation of first oxide layer 20, a patterned mask (not shown) is placed over the flash memory device such that high voltage area 15 of periphery region 13 and the entire memory array region 11 are covered. It will be understood that depending on specific process flows, various processing modules and implants may take place prior to the formation of the pattern mask. Once pattern mask is created over the flash memory device using conventional photolithography techniques, an additional deglaze is performed to etch any exposed portions of first oxide layer 20, notably those portions of first oxide layer 20 located within low voltage area 17 of periphery region 13, as shown in FIG. 6. Following the deglaze procedure the pattern mask is removed through known techniques such as resist ash.

Following the deglaze of first oxide layer 20 within low voltage area 17 of periphery region 13, the flash memory device comprises, as shown in FIG. 6, low voltage area 17 of periphery region 13 that does not contain first oxide layer 20, high voltage area 15 of periphery region 13 that contains first oxide layer 20 at a thickness of 120 Angstroms, and memory array region 11 containing first oxide layer 20 at a thickness at approximately 100 Angstroms.

Figure 7:
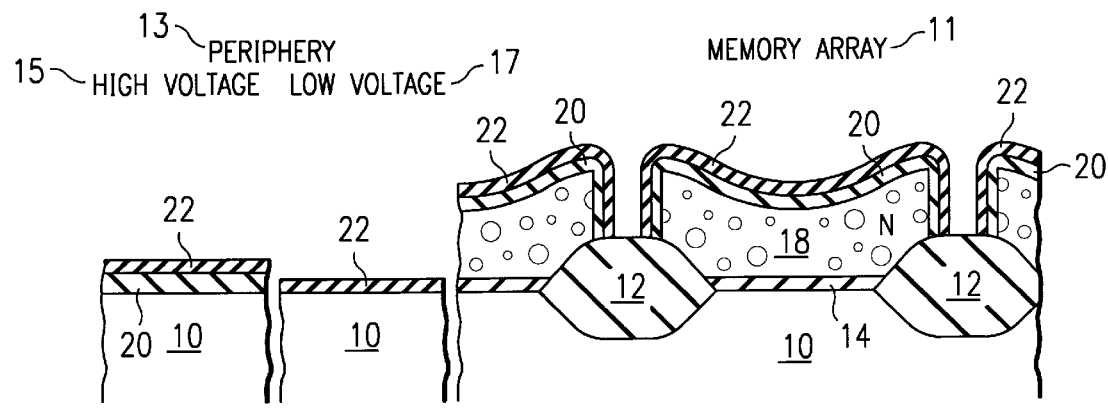

As shown in FIG. 7, after the pattern mask is removed, a second oxide layer 22 is grown outwardly from the surface of substrate 10 and from the surface of floating gate 18. It should be understood that silicon dioxide will continue to grow in high voltage area 15 of periphery region 13 and in memory array region 11, despite the silicon in those location being covered with first oxide layer 20. Oxidation in those locations will again begin to grow outwardly from the silicon surfaces such as substrate 10 and floating gate 18, thereby increasing the thickness of the oxide dielectric formed in first oxide layer 20. The additional growth and thickness caused by this new oxidation step is referred to as the second oxide layer 22.

It will again be understood here that because of the nitrogen dopant content of floating gate 18, the growth rate of oxidation outwardly from the surface of floating gate 18 will again be reduced from the rate of oxidation simultaneously experienced in low voltage area 17 and high voltage area 15 of the periphery region 13. Growth rate and oxidation present in low voltage area 17 and high voltage area 15 of periphery region 13 may also proceed at slightly different rates. This is due to the fact that the growth of second oxide layer 22 in low voltage area 17 of periphery region 13 first originates from the surface of bare silicon, as opposed to high voltage area IS of periphery region 13 that continues growing from first oxide layer 20. An oxidation process forming silicon dioxide initially proceeds at a slightly higher rate from bare silicon than it does when began on an area covered with prior oxidation.

As a result of these differences in growth rate, this second oxidation procedure producing second oxide layer 22 will form to a thickness of approximately 90 Angstroms over low voltage area 17 of periphery region 13, to a thickness of approximately 60 additional Angstroms over high voltage area 15 of periphery region 13, and to a thickness of approximately 50 additional Angstroms of oxide over memory array region 11 of the flash memory device. Thus, first and second oxide layers 20 and 22 combine to form an inter-level dielectric layer of three different thicknesses in three distinct areas of the flash memory device. The inter-level dielectric layer extends outwardly from the surface of substrate 10 to a thickness of 180 Angstroms in high voltage area 15 of periphery region 13, to a thickness of approximately 90 Angstroms over low voltage area 17 of periphery region 13, and outwardly from the surface of floating gate 18 to a thickness of approximately 150 Angstroms.

Inter-level dielectric layer thereby conformally covers floating gate 18, effectively isolating floating gate 18 from a control gate (not shown) of polysilicon material subsequently deposited outwardly from the inter-level dielectric layer directly over floating gate, thereby forming the basic elements of traditional stack structures found in memory array regions of flash memory devices.

Although the present invention has been described in detail, it should be understood that various changes, alterations, substitutions, and modifications to those descriptions contained herein may be made without departing from the scope and spirit of the present invention which is solely defined by the appended claims.

What is claimed is:

1. A method of forming a floating gate memory device having a memory array region, a first periphery region, and a second periphery region, the method comprising the steps of:

forming a polysilicon gate insulatively disposed outwardly from a substrate in the memory array region;

doping the polysilicon gate with nitrogen ions;

forming a first oxide layer outwardly from the substrate in the first periphery region and the second periphery region, and from the polysilicon gate in the memory array region, wherein a greater thickness of oxide is formed outwardly from the substrate relative to the thickness of oxide formed outwardly from the polysilicon gate;

removing the first oxide layer in the second periphery region; and forming a second oxide layer outwardly from the substrate in the second periphery region, from the first oxide layer in the first periphery region, and from the first oxide layer in the memory array region, wherein a greater thickness of oxide is formed in the first and second periphery region relative to the thickness of oxide formed in the memory array region.

2. The method of claim 1, wherein the step of forming a first oxide layer further comprises forming a first layer of silicon dioxide.

3. The method of claim 2, wherein the step of forming a second oxide layer further comprises forming a second layer of silicon dioxide.

4. The method of claim 1, wherein the steps of forming the first and second oxide layers comprise forming a dielectric layer, the dielectric layer having a different respective thickness of oxide over the first periphery region, second periphery region, and memory array region.

5. The method of claim 4, wherein the step of forming a dielectric layer further comprises:

forming a high voltage periphery dielectric layer;

forming a low voltage periphery dielectric layer; and forming a memory array dielectric layer.

6. The method of claim 1, wherein the step of doping a polysilicon gate further comprises implanting nitrogen dopants into a polysilicon gate at an energy of 25 KeV.

7. The method of claim 1, wherein the step of doping a polysilicon gate further comprises implanting nitrogen dopants into a polysilicon gate at a dosage of $1\times10^2$ cm$^{-3}$.

8. A method of forming a dielectric layer comprising the steps of:

forming a first silicon layer, the first silicon layer having a first area and a second area;

forming a second silicon layer;

doping the second silicon layer with nitrogen;

growing a first oxide layer outwardly from the first silicon layer and the second silicon layer, wherein doping the second silicon layer is operable to cause the first oxide layer to grow generally thicker outwardly from the first silicon layer relative to the second silicon layer;

removing the first oxide layer from the second area of the first silicon layer; and forming a second oxide layer outwardly from the first silicon layer and the second silicon layer, wherein doping the second silicon layer is operable to cause the second oxide layer to grow generally thicker outwardly from the first silicon layer relative to the second silicon layer.

9. The method of claim 8, wherein the step of forming a first oxide layer further comprises forming a first layer of silicon dioxide.

10. The method of claim 9, wherein the step of forming a second oxide layer further comprises forming a second layer of silicon dioxide.

11. The method of claim 8, wherein the steps of forming the first and second oxide layers further comprise forming a dielectric layer, the dielectric layer having a different respective thickness of oxidation over the first area of the first silicon layer, the second area of the first silicon layer, and the second silicon layer.

12. The method of claim 8, wherein the step of doping the second silicon layer further comprises exposing the second silicon layer to a nitrogen gas during deposition.

13. The method of claim 8, wherein the step of doping the second silicon layer further comprises implanting nitrogen dopants into the second silicon layer at an energy of 25 KeV.

14. The method of claim 8, wherein the step of doping the second silicon layer further comprises implanting nitrogen dopants into the second silicon layer at a dosage of $1\times10^{20}$ cm.

15. The method of claim 11, wherein the step of forming a dielectric layer further comprises:

forming a high voltage periphery dielectric layer, the high voltage periphery dielectric layer having a thickness;

forming a low voltage periphery dielectric layer, the low voltage periphery dielectric layer having a thickness less than the thickness of the high voltage periphery dielectric layer; and forming a memory array dielectric layer, the memory array dielectric layer having a thickness less than the thickness of the high voltage periphery dielectric layer and greater than the thickness of the low voltage periphery dielectric layer.

16. A method of forming a floating gate memory structure having a memory array region, a first periphery region, and a second periphery region, the method comprising the steps of:

forming an insulatively disposed polysilicon layer outwardly from a substrate;

forming a floating gate in the memory array region from the polysilicon layer, the floating gate comprising amorphous silicon, the floating gate being formed by a mask pattern, etch, and removal process operable to remove the polysilicon layer from unmasked portions of the memory array region and from both periphery regions;

introducing nitrogen into the amorphous silicon comprising the floating gate;

forming a first oxide layer outwardly from the substrate in the first and second periphery regions and the floating gate in the memory array region, wherein introducing nitrogen into the floating gate is operable to impede the formation of the first oxide layer outwardly from the floating gate;

removing the first oxide layer from the second periphery region; and forming a second oxide layer outwardly from the substrate in the second periphery region, from the first oxide layer in the first periphery region, and from the first oxide layer in the memory array region, wherein the step of introducing nitrogen is operable to impede the formation of the second oxide layer from the first oxide layer in the memory array region.

17. The method of claim 16, wherein the steps of forming the first and second oxide layer further comprise forming a dielectric layer, the dielectric layer having a different respective thickness of oxide over the first periphery region, over the second periphery region, and over the memory array region.

18. The method of claim 17, wherein the step of forming a dielectric layer further comprises:

forming a high voltage periphery dielectric layer, the high voltage periphery dielectric layer having a thickness;

forming a low voltage periphery dielectric layer, the low voltage periphery dielectric layer having a thickness less than the thickness of the high voltage periphery dielectric layer; and forming a memory array dielectric layer, the memory array dielectric layer having a thickness less than the thickness of the high voltage periphery dielectric layer and greater than the thickness of the low voltage periphery dielectric layer.

19. The method of claim 16, wherein the step of introducing nitrogen further comprises exposing the second silicon layer to a nitrogen gas during deposition.

20. The method of claim 16, wherein the step of introducing nitrogen further comprises implanting nitrogen dopants into the amorphous silicon at an energy of 25 KeV.

* * * * *